Jan. 29, 1963 J. L. ROBINSON ETAL 3,076,105

HIGH-SPEED TRANSISTOR MULTIVIBRATOR CIRCUIT HAVING CONSTANT-CURRENT BIASING TO PREVENT COMPLETE CUT-OFF OF EMITTER CURRENT

Filed Dec. 16, 1960

INVENTORS
JOHN L. ROBINSON
ADOLPH K. RAPP
BY
Fordyce A. Bothwell
ATTORNEY

United States Patent Office 3,076,105
Patented Jan. 29, 1963

3,076,105

HIGH-SPEED TRANSISTOR MULTIVIBRATOR CIRCUIT HAVING CONSTANT-CURRENT BIASING TO PREVENT COMPLETE CUT-OFF OF EMITTER CURRENT

John L. Robinson, Wenonah, N.J., and Adolph K. Rapp, Philadelphia, Pa., assignors, by mesne assignments, to Philco Corporation, Philadelphia, Pa., a corporation of Delaware Filed Dec. 16, 1960, Ser. No. 76,308
2 Claims. (Cl. 307—88.5)

This invention relates to transistor circuits and more particularly to the speed of operation of transistor circuits whose operation involves turn-on and turn-off actions.

In some usages of the transistor its speed of operation is an important factor. An example of such a usage is found in the type of transistor switching circuit known as a "current switching" circuit, in which current from a common source is switched selectively into either of a pair of circuit branches, each including a transistor, by turning one transistor on and the other off. Prior circuits of this type have been inhibited as to their rapidity of operation due to the fact that when either of the transistors is turned off, its normal input capacitance is charged by an applied back bias which, though desirable for noise immunity, tends to delay the turn-on operation. Furthermore operation of the transistors in the region of cut off also impedes the speed of operation.

The principal object of the present invention is to overcome these objections in transistor circuits whose operation heretofore has involved turn-off and turn-on of a transistor. This invention is based on the concept that it is unnecessary in such circuits to effect complete cut off of a transistor, and that prevention of complete cut off is the crux of the solution of the problem.

Another object of this invention is to provide simple but effective means for increasing the speed of operation of such transistor circuits.

Still another object of the invention is to increase the speed of operation of current switching circuits involving selective switching action of current into a pair of circuit branches.

In accordance with this invention, in a transistor circuit of the turn-on and turn-off type provision is made to prevent complete cut off of a transistor by (1) connecting source of current of small magnitude to its emitter and (2) connecting a diode in series with the principal emitter circuit so that it rather than the transistor is turned on and off. With the diode turned off its relatively lower capacitance than the input capacitance of an "off" transistor enables it to be turned on faster and thus the turn-on operation is performed more rapidly than in prior circuits of this type. Moreover the transistor is prevented from operating in the region near cut off and this also enables more rapid operation.

In the application of the invention to a current switching circuit, provision is made to prevent complete cut off of each transistor, and a diode is connected in each emitter circuit so that the current switching is effected by turning one of the diodes on and the other off.

Figure 1:
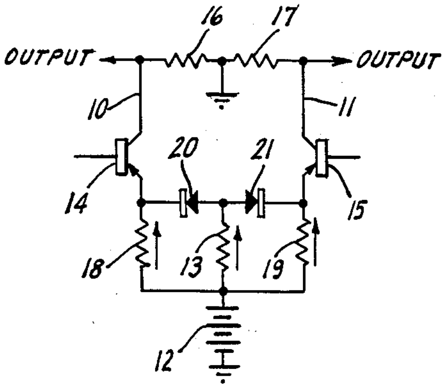
Figure 2:
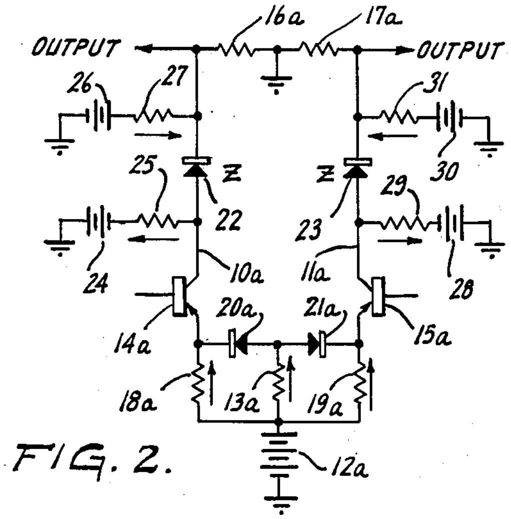
Figure 3:
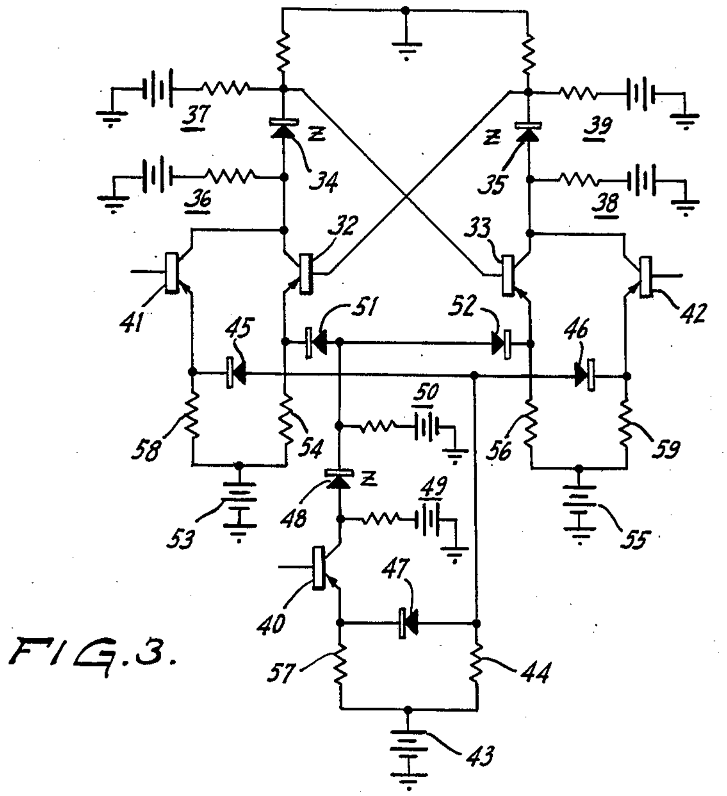

The invention may be fully understood from the following detailed description wtih reference to the accompanying drawings wherein FIG. 1 is a schematic illustration of a current switching transistor circuit embodying the invention;

FIG. 2 is a schematic illustration of a preferred form of current switching transistor circuit embodying the invention; and FIG. 3 is a schematic illustration of a multivibrator embodying the invention.

Referring first to FIG. 1, the circuit shown comprises a pair of circuit branches 10 and 11 into which current is selectively switched from a constant-current source comprising a voltage source represented by battery 12 and a series resistor 13. A pair of transistors 14 and 15 are connected respectively in the circuit branches 10 and 11. While the transistors are shown as being of the P-N-P type, they could be of the N-P-N type. The collectors of the two transistors are connected to respective load resistors 16 and 17 and outputs are derived as shown.

As thus far described the circuit is of known form. In operation without this invention, one transistor is turned on and the other transistor is turned off according to control voltages applied to their bases. With current flowing through the "on" transistor, a positive output voltage is produced at its output.

In accordance with this invention, resistors 18 and 19 are connected between battery 12 and the respective emitters. These resistors in combination with battery 12 provide auxiliary constant-current sources. The current supplied from these sources is substantially less than that supplied through resistor 13. For example, the current through resistor 13 which is switched between circuit branches 10 and 11 may be 6 milliamperes, while the current through each of the resistors 18 and 19 may be 1 milliampere. Also in accordance with this invention, high-speed diodes 20 and 21 are connected between resistor 13 and the respective emitters of the two transistors.

With the arrangement provided by this invention, the switching action is caused to be substantially more rapid, since neither transistor is completely cut off and the high-speed diode associated with each transistor decreases the input capacitance to the transistor. In the absence of this invention and with either transistor completely cut off, the base-to-emitter capacitance of the "off" transistor would be charged by the applied back-bias voltage, which would impede turn-on of the transistor. By virtue of this invention, however, the diodes rather than the transistors are turned on and off, and with either diode turned off its relatively lower capacity enables it to be turned on faster and thus the turn-on operation is performed more rapidly at the same time the back bias across the "off" diode provides the desired noise immunity.

Another advantage of the invention is that a circuit embodying the invention has decreased rise and fall times when it drives similar circuits, due to the decreased input capacitance of those circuits.

Another advantage of the invention with respect to greater speed of operation is that it effects better utilization of the gain-bandwidth of a transistor because the transistor is prevented from operating in the region near cut off where its gain-bandwidth becomes small.

Still another advantage of the invention is that the reverse breakdown-voltage limitation of a diode is substituted for the reverse base-emitter voltage limitation of a transistor. This is advantageous because the emitter diodes of transistors normally used in high-speed circuits have low breakdown voltages.

Referring now to FIG. 2 there is shown a preferred form of current switching circuit embodying the present invention. The elements corresponding to those of FIG. 1 are designated by the same reference numerals with the addition of the suffix *a*. Except for the arrangement provided by this invention, the circuit of FIG. 2 is of known form. In this circuit Zener diodes 22 and 23 are included in the respective circuit branches 10*a* and 11*a*. Voltage source 24 and resistor 25 constitute a current source connected to one side of Zener diode 22, and voltage source 26 and resistor 27 constitute another current source connected to the opposite side of the same diode. Similarly, voltage source 28 and resistor 29 constitute a current source connected to one side of Zener diode 23, and voltage source 30 and resistor 31 constitute another current source connected to the opposite side of the same diode. In this circuit the elements provided by the present invention, i.e. elements 18*a* to 21*a*, serve the same purposes as in the circuit of FIG. 1 as described above.

Referring now to FIG. 3, there is shown a current-switching multivibrator of the type disclosed and claimed in the copending application of J. L. Robinson, Serial No. 40,741 filed July 5, 1960, assigned to the assignee of the present invention, in which this invention has been embodied. Except for the incorporation of this invention, the circuit shown is substantially similar to that shown in said copending application. It comprises transistors 32 and 33, Zener diodes 34 and 35, current sources 36 to 39 connected as shown and each comprising a voltage source and a resistor, and three transistors 40, 41 and 42 by which the multivibrator is controlled.

In accordance with the present invention, a constant-current source comprising voltage source 43 and resistor 44 is connected through high speed diodes 45 and 46 to the emitters of transistors 41 and 42, and is also connected through high speed diode 47 to the emitter of transistor 40. The circuit branch including transistor 40 also preferably includes a Zener diode 48 and associated current sources 49 and 50, and is connected through high speed diodes 51 and 52 respectively to the emitters of transistors 32 and 33. To prevent the various transistors from being completely cut off, current sources are connected to their emitters to supply a small amount of current thereto. These sources comprise current source 53, 54 connected to the emitter of transistor 32, current source 55, 56 connected to the emitter of transistor 33, current source 43, 57 connected to the emitter of transistor 40, current source 53, 58 connected to the emitter of transistor 41, and current source 55, 59 connected to the emitter of transistor 42.

In operation of the multivibrator, as described in the aforementioned copending application, the conduction state of the multivibrator is changed through controlling action of the control transistors 40, 41 and 42 in response to control potentials applied thereto. More particularly, the multivibrator is driven from either of its conduction states to the other by turning one of the transistors 32 and 33 on and by turning the other transistor off, and this is done by selective turn-on and turn-off of the control transistors.

The incorporation of the present invention prevents the various transistors from being completely cut off and the diodes 45, 46, 47, 51 and 52 rather than the transistors are turned on and off, thus achieving the advantages hereinbefore mentioned.

It will be understood of course that the invention is not limited to the specific circuits shown, the invention contemplating such modifications and further embodiments as may occur to those skilled in the art.

We claim:

1. In a current switching multivibrator circuit, first and second transistors interconnected to form a multivibrator, first and second constant current sources connected respectively to the emitters of said transistors, first and second oppositely-poled diodes serially connected between the emitters of said transistors, third and fourth transistors connected respectively to said first and second transistors to control the same, third and fourth constant current sources connected respectively to the emitters of said third and fourth transistors, third and fourth oppositely-poled diodes serially connected between the emitters of said third and fourth transistors, a fifth constant current source and a fifth transistor serially connected to the junction of said first and second diodes, and a sixth constant current source connected to the junction of said third and fourth diodes.

2. In a current switching multivibrtaor circuit, first and second transistors interconnected to form a multivibrator, first and second constant current sources connected respectively to the emitters of said transistors, first and second oppositely-poled diodes serially connected between the emitters of said transistors, third and fourth transistors connected respectively to said first and second transistors to control the same, third and fourth constant current sources connected respectively to the emitters of said third and fourth transistors, third and fourth oppositely-poled diodes serially connected between the emitters of said third and fourth transistors, a fifth constant current source and a fifth transistor serially connected to the junction of said first and second diodes, a sixth constant current source connected to the junction of said third and fourth diodes, and a fifth diode connected between said sixth current source and the emitter of said fifth transistor.

References Cited in the file of this patent

UNITED STATES PATENTS

| | | |
|---|---|---|
| 2,880,330 | Linvill et al. | Mar. 31, 1959 |
| 2,888,578 | Bruce | May 26, 1959 |
| 2,990,478 | Scarbrough | June 27, 1961 |
| 2,990,479 | Henle | June 27, 1961 |